United States Patent
West et al.

(10) Patent No.: US 9,704,804 B1
(45) Date of Patent: Jul. 11, 2017

(54) OXIDATION RESISTANT BARRIER METAL PROCESS FOR SEMICONDUCTOR DEVICES

(71) Applicant: Texas Instruments Incorporated, Dallas, TX (US)

(72) Inventors: Jeffrey A. West, Dallas, TX (US); Kezhakkedath R. Udayakumar, Dallas, TX (US); Eric H. Warninghoff, Allen, TX (US); Alan G. Merriam, Plano, TX (US); Rick A. Faust, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/974,012

(22) Filed: Dec. 18, 2015

(51) Int. Cl.
| | | |
|---|---|---|
| *H01L 21/44* | (2006.01) | |
| *H01L 23/532* | (2006.01) | |
| *H01L 21/768* | (2006.01) | |
| *H01L 23/528* | (2006.01) | |
| *H01L 23/522* | (2006.01) | |
| *H01L 21/311* | (2006.01) | |

(52) U.S. Cl.
CPC .. *H01L 23/53238* (2013.01); *H01L 21/31111* (2013.01); *H01L 21/76814* (2013.01); *H01L 21/76852* (2013.01); *H01L 21/76861* (2013.01); *H01L 21/76892* (2013.01); *H01L 23/528* (2013.01); *H01L 23/5226* (2013.01)

(58) Field of Classification Search
CPC .......... H01L 23/53238; H01L 23/528; H01L 23/5226; H01L 21/76861; H01L 21/76892
USPC ................... 438/653, 618; 257/773, 786, 737
See application file for complete search history.

(56) References Cited

U.S. PATENT DOCUMENTS

| | | | | |
|---|---|---|---|---|
| 5,821,620 A | * | 10/1998 | Hong ................ | H01L 21/76838 257/751 |
| 6,207,222 B1 | * | 3/2001 | Chen ................. | H01L 21/76831 205/123 |
| 6,268,291 B1 | * | 7/2001 | Andricacos ....... | H01L 21/76883 257/E21.175 |
| 6,500,750 B1 | * | 12/2002 | Shroff .............. | H01L 21/76807 257/E21.508 |
| 7,105,914 B2 | * | 9/2006 | Farrar .............. | H01L 21/76843 257/295 |
| 2007/0166995 A1 | * | 7/2007 | Malhotra .......... | H01L 21/28562 438/618 |
| 2010/0252933 A1 | * | 10/2010 | Tanaka ............. | H01L 21/76801 257/773 |
| 2011/0101527 A1 | * | 5/2011 | Cheng .............. | H01L 24/11 257/738 |
| 2011/0260317 A1 | * | 10/2011 | Lu ................... | H01L 24/11 257/737 |
| 2012/0074573 A1 | * | 3/2012 | Dallmann ......... | H01L 21/76843 257/751 |

* cited by examiner

*Primary Examiner* — Nitin Parekh
(74) *Attorney, Agent, or Firm* — Jacqueline J. Garner; Charles A. Brill; Frank D. Cimino

(57) ABSTRACT

An integrated circuit and method comprising an underlying metal geometry, a dielectric layer on the underlying metal geometry, a contact opening through the dielectric layer, an overlying metal geometry wherein a portion of the overlying metal geometry fills a portion of the contact opening, and an oxidation resistant barrier layer disposed between the underlying metal geometry and overlying metal geometry. The oxidation resistant barrier layer is formed of TaN or TiN with a nitrogen content of at least 20 atomic % and a thickness of at least 5 nm.

20 Claims, 6 Drawing Sheets

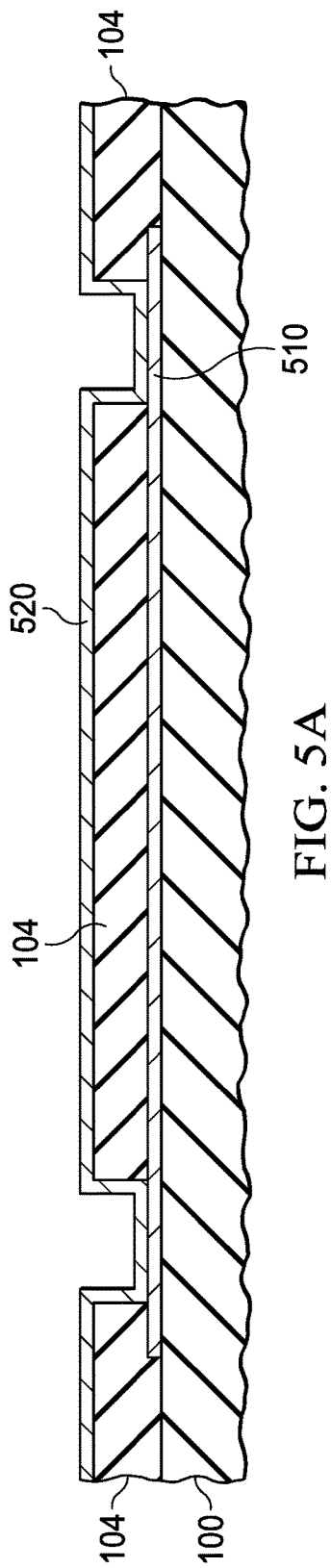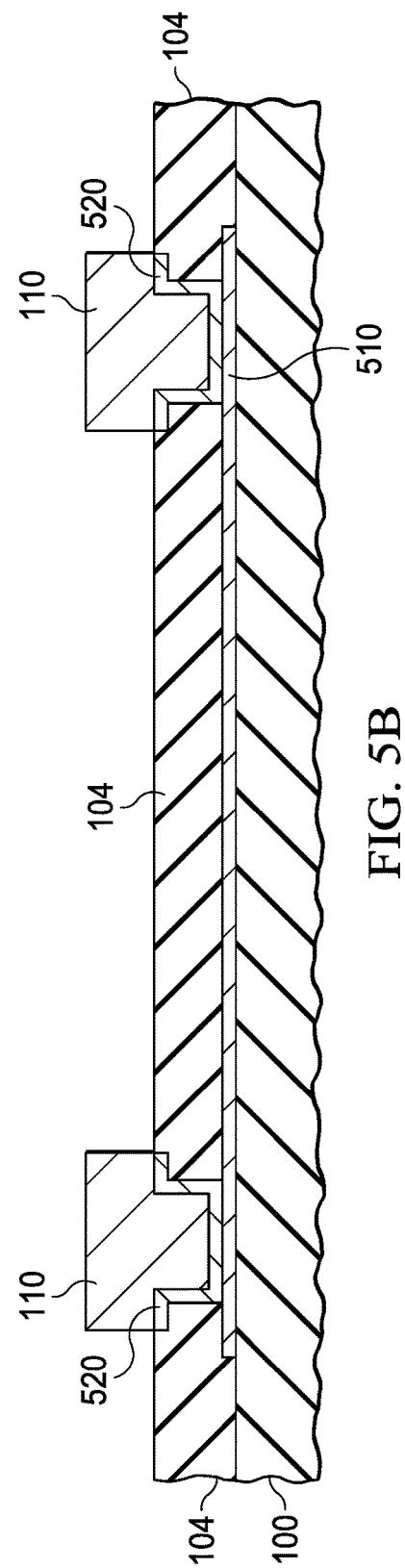

OXIDATION RESISTANT BARRIER METAL PROCESS FOR SEMICONDUCTOR DEVICES

FIELD

This invention relates to the field of integrated circuits. More particularly, this invention relates to the formation of contacts with stable resistance in integrated circuits.

BACKGROUND

During processing of an integrated circuit, openings typically referred to as contacts or vias are made through dielectric overlying metal interconnect leads to form electrical contact to the leads. The metal interconnect that is exposed in the these contact or via openings may form a layer of metal oxide on the surface that increases the electrical contact resistance and also may cause significant variation in the electrical contact resistance in these openings across an integrated circuit chip or wafer.

A typical example of forming an aluminum bond pad 110 on a top layer of copper interconnect 102 is illustrated in FIG. 1B. The underlying copper interconnect layer 102 is formed in a dielectric layer 100 using either a single or a dual damascene process. An opening is formed in dielectric layer 104 overlying the copper interconnect layer to form electrical connection to an overlying aluminum bondpad 110. An interdiffusion barrier layer 106 of a material such as Ta or TaN is disposed between the underlying copper interconnect and the overlying aluminum bondpad 110 to prevent interdiffusion of copper and aluminum.

A typical example of forming an upper level of aluminum interconnect 210 on a lower layer of copper interconnect 202 is illustrated in FIG. 2B. The underlying copper interconnect layer 202 is formed in a dielectric layer 200 using either a single or a dual damascene process. Contact or via openings are formed in dielectric layer 204 overlying the copper interconnect layer 202 to form electrical connection between the interconnect layers 202 and 210. An interdiffusion barrier layer 206 of a material such as Ta or TaN is disposed between the underlying copper interconnect 202 and the overlying aluminum interconnect 210 to prevent interdiffusion of copper and aluminum.

As illustrated in TABLE 1, the $Ta_xO_y$ (or $Ta_xN_yO_z$) layer that forms on the TaN interdiffusion barrier layer 106 (FIG. 1A) and layer 206 (FIG. 2A) causes the contact resistance to increase by 6× after 12 hours of exposure to air and by 10× after 24 hours of exposure to air. In addition, the increase in electrical contact resistance caused by the $Ta_xO_y$ layer typically varies significantly from contact to contact. Those skilled in the art will recognize that the magnitude of the increase in electrical resistance depends on both the test structure and measurement technique used; TABLE 1 was generated from 4-point probe measurements to maximize sensitivity to interface resistance and is intended solely to provide a baseline reference for quantifying the improvement afforded by the invention.

TABLE 1

| TaN in via exposure to air | Resistance Increase |
| --- | --- |
| 12 hours | 6× |
| 24 hours | 10× |

The metal oxide layer may be removed by various means such as sputter etching prior to deposition of the aluminum bondpad metal 110 or the upper aluminum interconnect metal 210, but this often causes other problems. For example if an argon sputter etch is used to remove the $Ta_xO_y$ layer that forms on the TaN barrier layer 106 and 206 prior to AlCu 110 and 210 deposition, the sputter etch process introduces particles which reduces yield. In addition the presputter etch alters the morphology of the deposited AlCu, 110 or 210, resulting in a decrease in electromigration resistance.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit and method comprising an underlying metal geometry, a dielectric layer on the underlying metal geometry, a contact opening through the dielectric layer, an overlying metal geometry wherein a portion of the overlying metal geometry fills a portion of the contact opening, and an oxidation resistant barrier layer disposed between the underlying metal geometry and overlying metal geometry. The oxidation resistant barrier layer is formed of TaN or TiN with a nitrogen content of at least 20 atomic % and a thickness of at least 5 nm.

DESCRIPTION OF THE VIEWS OF THE DRAWINGS

FIGS. 5A and 5B are cross-sections of a lower metal to upper metal contact with an oxidation resistant barrier layer formed according to embodiments wherein the oxidation resistant barrier layer covers the sidewalls and the bottom of the contact.

DETAILED DESCRIPTION OF EXAMPLE EMBODIMENTS

Embodiments of the invention are described with reference to the attached figures. The figures are not drawn to scale and they are provided merely to illustrate the invention. Several aspects of the embodiments are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The embodiments are not limited by the illustrated ordering of acts or events, as some acts may occur in different orders and/or concurrently with other acts or events. Furthermore, not all illustrated acts or events are required to implement a methodology in accordance with the present invention.

Figure 1A:
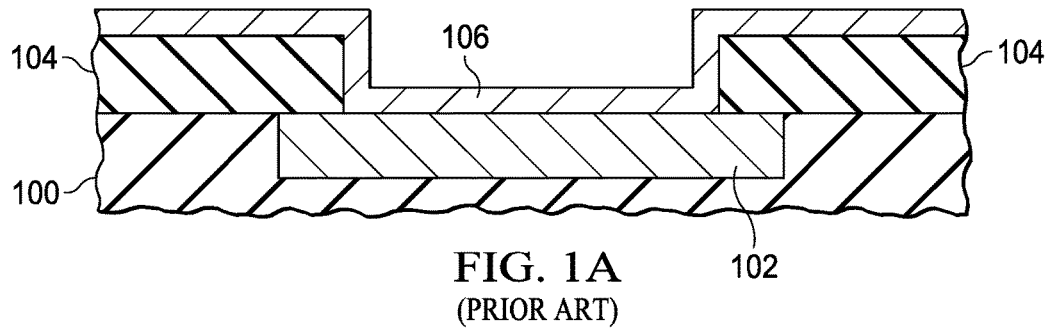
FIGS. 1A and 1B (Prior art) are cross-sections of a lower copper interconnect to upper aluminum bondpad metal contact with an interdiffusion barrier in the bottom of the contact.
Figure 1B:
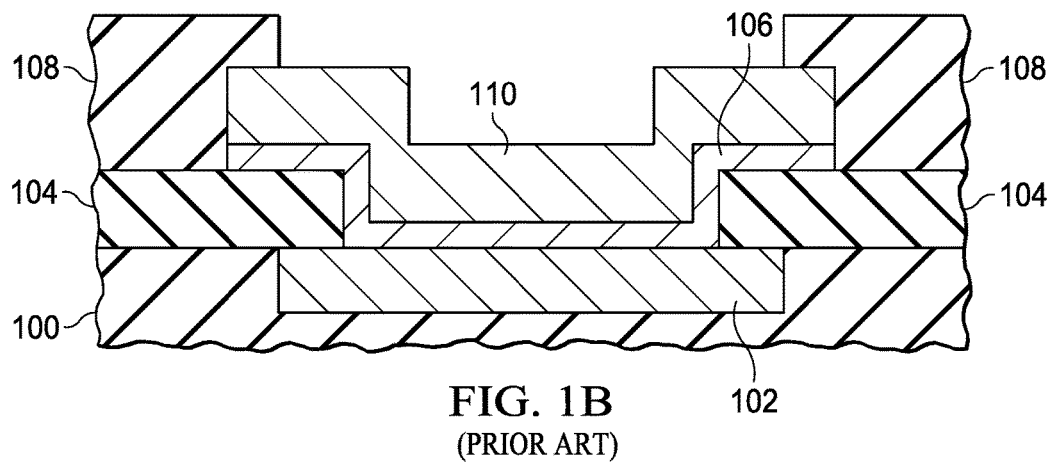
Figure 2A:
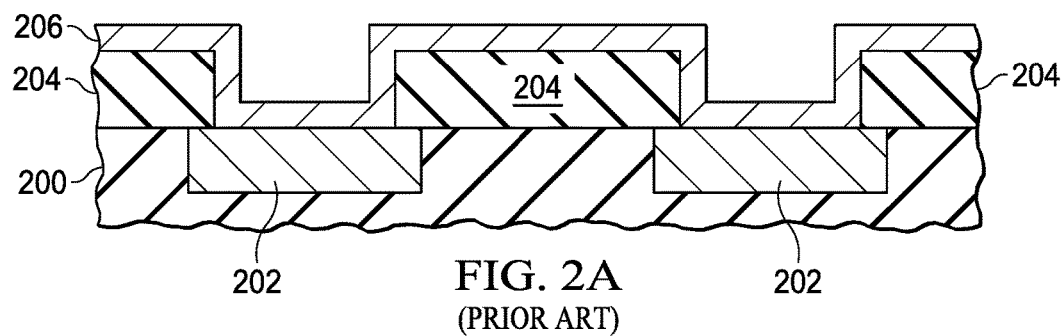
FIGS. 2A and 2B (Prior art) are cross-sections of a lower copper interconnect to upper aluminum interconnect metal contact with an interdiffusion barrier in the bottom of the contact.
Figure 2B:
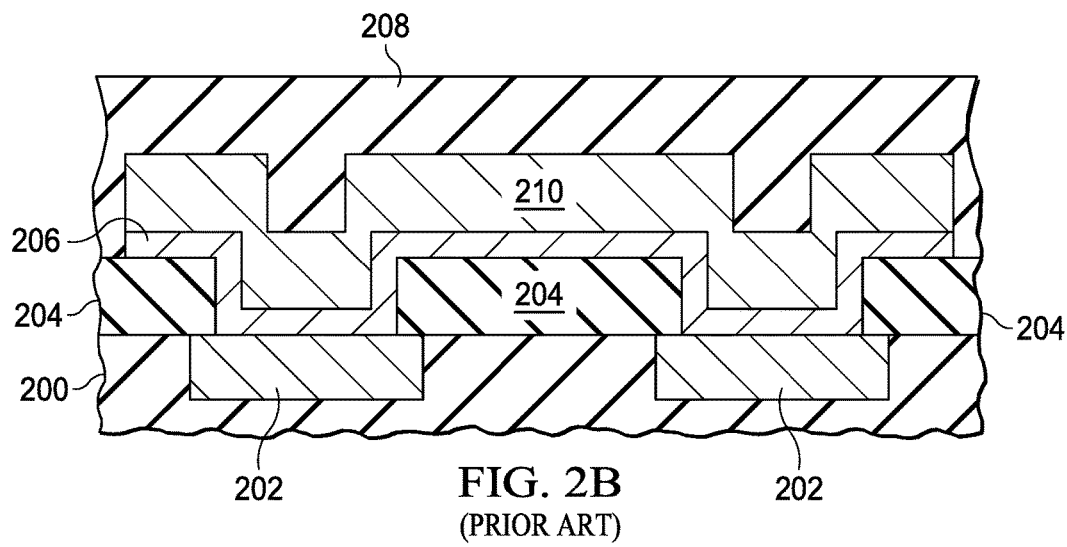
Figure 3A:
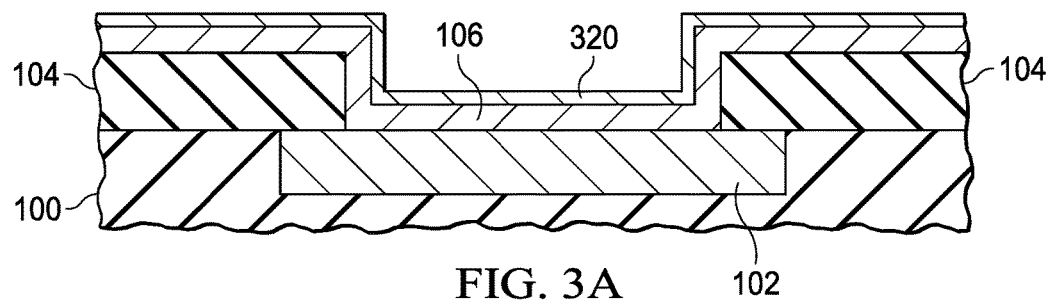
FIGS. 3A and 3B are cross-sections of a lower copper interconnect to upper aluminum bondpad contact with an interdiffusion barrier plus an oxidation resistant barrier layer formed according to embodiments.
Figure 3B:
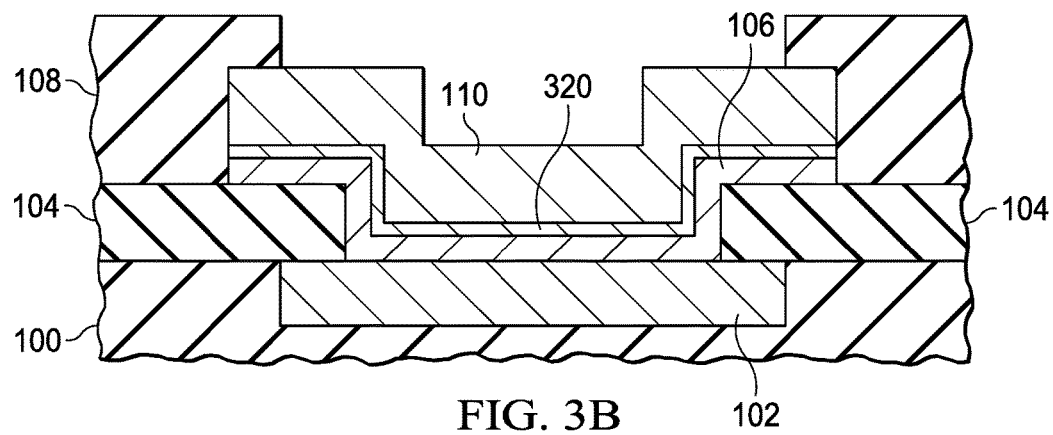

An aluminum copper (AlCu) bondpad 110 to underlying copper interconnect 102 structure with an interdiffusion barrier layer 106 and with an embodiment oxidation resistant barrier layer 320 is illustrated in FIG. 3B. A copper interconnect geometry 102 is formed in a dielectric layer 100 using a damascene process. A dielectric layer 104 with a contact opening to the copper interconnect geometry 102 overlies dielectric layer 100 and copper interconnect geometry 102. A bondpad stack comprised of an interdiffusion barrier layer 106, an embodiment oxidation resistant barrier surface (ORBS) layer 320 and aluminum or aluminum copper alloy 110 overlies the dielectric layer 104 and contacts the underlying copper interconnect geometry 102 through the contact opening in dielectric layer 104. The interdiffusion barrier layer 106 may be a material such as TaN or TiN with a thickness between about 60 nm and 90 nm, and a nitrogen content between about 0 and 12 atomic percent. The ORBS layer 320 may be nitrogen rich tantalum nitride with nitrogen content in the range of about 20 to 35 atomic percent and a thickness in the range of about 5 nm to 15 nm. The ORBS layer 320 may also be a nitrogen rich titanium nitride with a thickness slightly higher than the nitrogen rich tantalum nitride oxidation resistant layer.

Figure 4A:
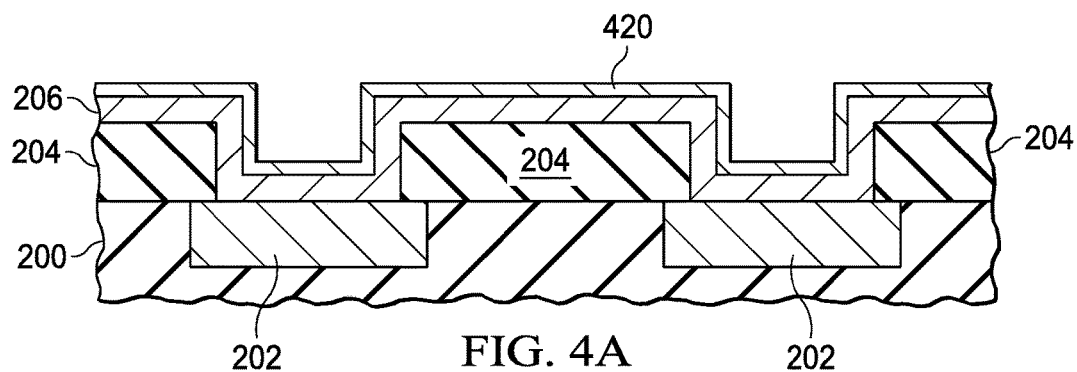
FIGS. 4A and 4B are cross-sections of a lower copper interconnect to upper aluminum interconnect contact with an interdiffusion barrier plus an oxidation resistant barrier layer formed according to embodiments.
Figure 4B:
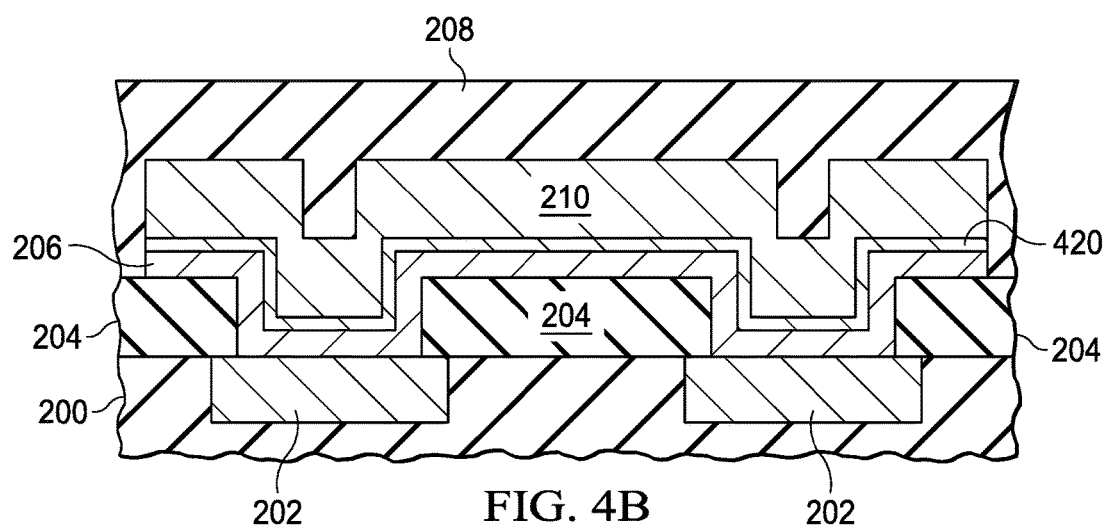

An aluminum copper (AlCu) interconnect 210 to underlying copper interconnect 202 structure with an interdiffusion barrier layer 206 and with an embodiment oxidation resistant barrier layer 420 is illustrated in FIG. 4B. A copper interconnect geometry 202 is formed in a dielectric layer 200 using a damascene process. A dielectric layer 204 with contact or via openings to the copper interconnect geometries 202 overlies dielectric layer 200 and copper interconnect geometries 202. A upper aluminum interconnect stack comprised of an interdiffusion barrier layer 206, an embodiment oxidation resistant barrier surface (ORBS) layer 420 and aluminum or aluminum copper alloy 210 overlies the dielectric layer 204 and contacts the underlying copper interconnect geometries 202 through the contact or via openings in dielectric layer 204. The interdiffusion barrier layer 206 may be a material such as TaN or TiN with a thickness between about 60 nm and 90 nm, and a nitrogen content between about 0 and 12 atomic percent. The ORBS layer 420 may be nitrogen rich tantalum nitride with nitrogen content in the range of about 20 to 35 atomic percent and a thickness in the range of about 5 nm to 15 nm. The ORBS layer 420 may also be a nitrogen rich titanium nitride with a thickness slightly higher than the nitrogen rich tantalum nitride oxidation resistant layer.

The ORBS layers 320 and 420 enable the IC to be exposed to air for 24 hours or longer prior to deposition of the bondpad metal 110 or the upper aluminum interconnect metal 210 with an increase in contact resistance of less than 2×. In addition with the ORBS layers 320 and 420 the resistance of many contacts or vias across the integrated circuit (IC) chip and across the IC wafer remains tightly distributed.

A copper interconnect interdiffusion barrier layer with an embodiment oxidation resistant barrier layer structure is used for illustration. In this structure, an interdiffusion barrier layer 106 or 206 is required to prevent interdiffusion of copper and aluminum. If the underlying interconnect layer is another material such as TiW or W which does not interdiffuse with AlCu, the barrier layer 106 or 206 may be omitted and the ORBS layer 320 or 420 may be deposited directly on the underlying interconnect.

Overlying aluminum or aluminum copper is used in FIGS. 3 and 4 for illustration. Other overlying metals such as nickel palladium alloy may be used for the overlying bondpad 110 or overlying interconnect 210 material instead of aluminum or aluminum copper.

When the underlying metal layer is formed by deposition, pattern, and etch instead of by a damascene process, two options for the embodiment ORBS layer are available. As with an underlying metal geometry formed using a damascene process, a contact opening may be formed in a dielectric layer that overlies the underlying metal layer and the ORBS layer may be deposited on the dielectric layer and into the contact opening as described above. Alternatively, for metal geometries formed by deposition, pattern, and etch the ORBS layer may be deposited on the underlying metal layer (or on a barrier layer on the underlying metal layer) prior to patterning and etching to form the underlying metal layer geometry. In this alternative structure a contact opening is etched through an overlying dielectric layer stopping on the ORBS layer. This contact opening with the ORBS layer in the bottom may be exposed to air for an extended time (up to 24 hours) with little (less than 2×) increase in contact resistance.

A structure in which the underlying metal layer 510 is deposited, patterned and etched and the embodiment oxidation resistant barrier layer 520 is deposited into a contact opening in a dielectric 104 overlying the underlying metal layer 510 is illustrated in FIG. 5B. The underlying metal layer 510 to which contact is made may be a metal resistor or an electrical fuse (efuse) or a top plate of a metal-to-metal capacitor for example.

The oxidation resistant barrier layer 520 is deposited into openings in the dielectric 104 overlying the metal layer 510 to form electrical contact to underlying metal layer 510, as shown in FIG. 5A. Top metal 110 which overlies the oxidation resistant barrier 520 may be used to form a bondpad or may be used as an upper layer of interconnect. In this example, a metal which does not require an interdiffusion barrier layer is used for illustration so the oxidation resistant barrier 520 may be deposited directly onto the underlying metal layer 510.

The ORBS layer which may be nitrogen rich TaN as described previously provides low and consistent contact resistance across a wafer and also increases the span of time (process window) that the wafer may be exposed to air between oxidation resistant barrier layer 520 deposition and top metal 110 deposition thus improving manufacturability.

Figure 6A:
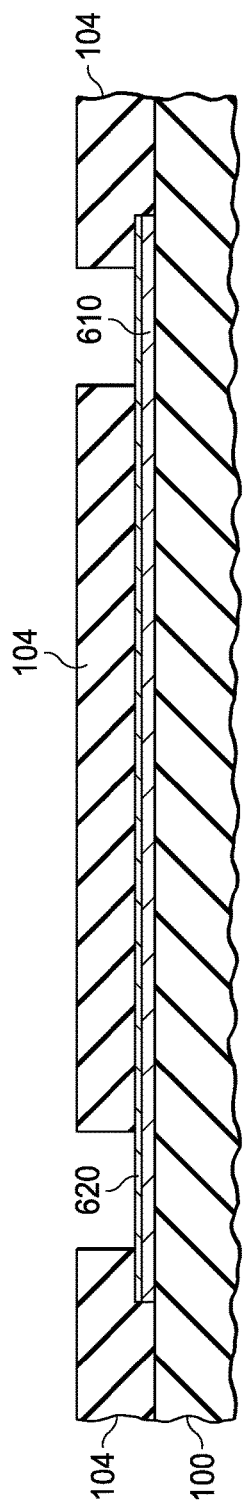
FIGS. 6A and 6B are cross-sections of a lower metal to upper metal contact with an oxidation resistant barrier layer formed according to principles of the invention wherein the oxidation resistant barrier layer covers the lower metal geometry.
Figure 6B:
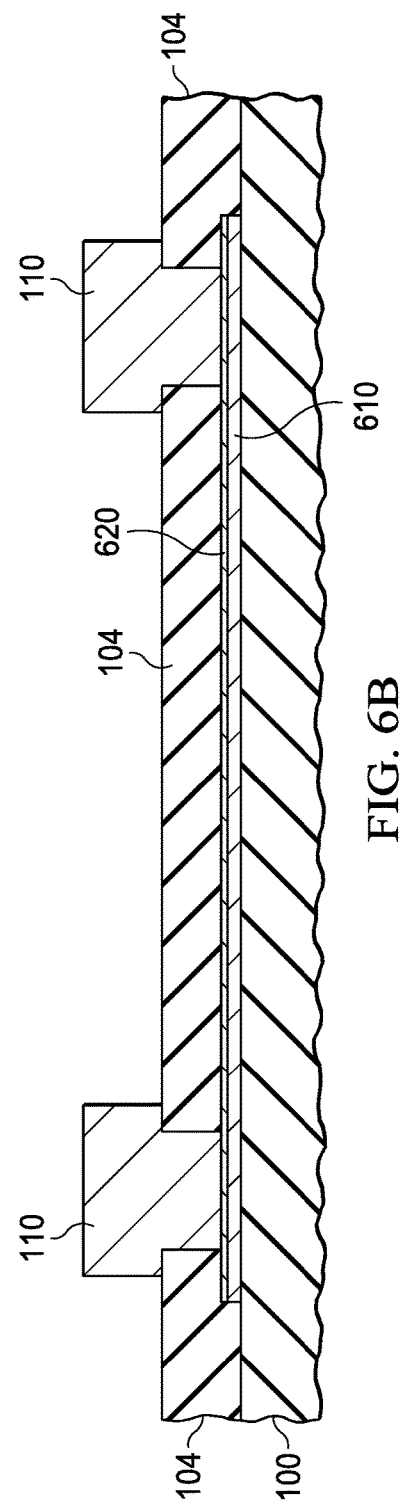

Another structure in which an embodiment oxidation resistant barrier layer 620 is deposited on the underlying metal layer 610 prior to patterning and etching to form the underlying metal layer 610 geometry is shown in FIG. 6B. The lower metal layer 610 for example, may be a top capacitor plate or a metal resistor. An optional interdiffusion barrier layer may be deposited on the underlying metal layer 610 prior to deposition of the ORBS layer 620 if needed.

In this structure, contact or via openings are etched through an overlying dielectric layer 104 and stop on the ORBS layer 620 which is on top of the underlying metal layer 610, as shown in FIG. 6A. The top metal 110 is deposited directly onto the ORBS layer 620 that is exposed in the bottom of the contact or via openings. The ORBS layer 620 may be exposed to air for up to 24 hours with less than a 2× increase in resistance. In addition the distribution of contact or via resistance across contacts across an IC chip or across an IC wafer remains tightly distributed.

Figure 7:
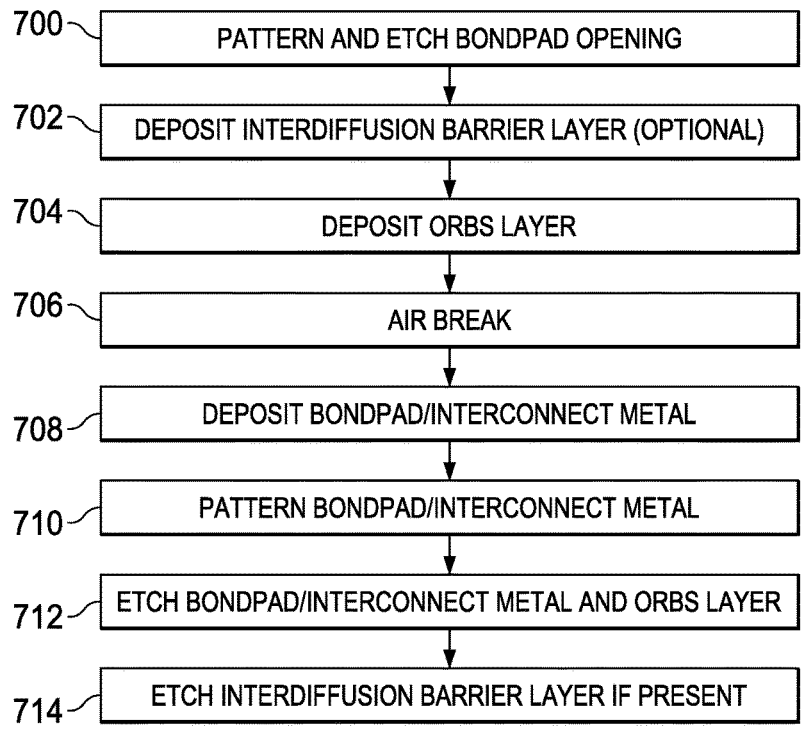
FIG. 7 is a flow diagram describing the primary manufacturing steps used to form the contact structures depicted in FIGS. 2A, 2B, 3A, 3B, 4A, 4B, 5A, and 5B.

FIG. 7 is a process flow diagram for a method for forming contacts using an embodiment ORBS layer such as those shown in FIGS. 3A, 3B, 4A, 4B, and 5A and 5B.

In step 700 a contact pattern is formed on a dielectric layer 104 overlying the underlying metal 102 (FIG. 3A) or 202 (FIG. 4A) or 510 (FIG. 5A) and openings are etched through the dielectric layer 104 (FIG. 3A, 5A) or 204 (FIG. 4A) stopping on the underlying metal layer 102/202/510.

In step 702 an optional interdiffusion barrier layer 106 (FIG. 3A) or 206 (FIG. 4B) may be deposited over the dielectric layer 104 or 204 and into the contact opening. A degas step (for example a bake at a temperature in the range of 250° C. to 400° C. under reduced pressure) and/or a presputter clean step (for example an argon presputter clean) or a reactive preclean (for example a high bias preclean with hydrogen plus argon or hydrogen plus helium) may be performed prior to the interdiffusion barrier layer 106 (FIG. 3A) or 206 (FIG. 4A) deposition. FIGS. 3A and 4A illustrate a process flow that incorporates the optional interdiffusion barrier layer 106 or 206. FIG. 5A illustrates a process flow that does not incorporate an interdiffusion barrier layer. The interdiffusion barrier layer may be TaN or TiN with a thickness between about 60 nm and 90 nm and a nitrogen content between about 0 atomic % and 12 atomic %.

In step 704 the embodiment oxidation resistance barrier surface (ORBS) layer, 320 (FIG. 3A) or 420 (FIG. 4A) is deposited. The ORBS layer, 320 (FIG. 3A) or 420 (FIG. 4A), may be a high nitrogen content TaN layer with a thickness between about 5 nm and 15 nm and a nitrogen content of about 20 atomic % to 35 atomic %. One tool that the ORBS film may be deposited in is an EnCoRel chamber on the Applied Endura platform. In this tool, the ORBS layer may be deposited at room temperature with a pressure between about 2.5 and 5 torr, a power in the range of 15 to 30 KW, a bias in the range of 250 W to 500 W and a flow rate of nitrogen in the range of about 115 to 125 sccm. The deposition time may vary depending upon the deposition conditions. A time sufficient to deposit a TaN film with a thickness in the range of 5 nm to 15 nm is used.

Other deposition tools with different deposition conditions may be utilized by those skilled in the art to produce an equivalent ORBS TaN film with a thickness in the range of 5 nm to 15 nm and a nitrogen content in the range of 20 atomic % to 35 atomic %.

In step 706 the ORBS film may be exposed to air for an extended length of time if desired. At least a short exposure to air may be desirable. The air exposure may affect the grain structure and electromigration resistance of subsequently deposited interconnect or bondpad metal. The ORBS film enables the IC wafer to be exposed to air for an extended period of time (24 hours) with less than a 2× increase in resistance. In addition the distribution of resistance of all the contacts across an IC chip and across an IC wafer remains tightly distributed.

In step 708 an upper metal used for either interconnect or bondpad formation is deposited on the oxidation resistant barrier surface (ORBS) layer.

In step 710 the upper metal used for either interconnect or bondpad formation is patterned.

In step 712 the upper metal used for either interconnect or bondpad formation is etched and the ORBS material is etched.

In step 714 the interdiffusion barrier layer is etched if it is present.

Figure 8:
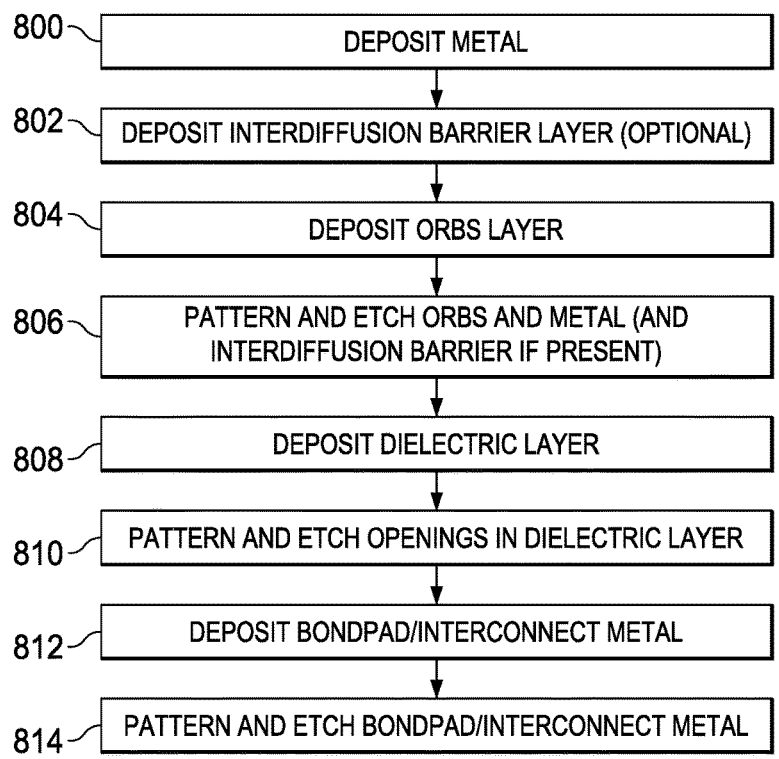
FIG. 8 is a flow diagram describing the primary manufacturing steps used to form the contact structures depicted in FIGS. 6A and 6B.

FIG. 8 is a process flow diagram for a method for forming contacts using an ORBS layer 620 (FIG. 6A) that is deposited on an underlying metal layer 610 prior to patterning and etching to form the underlying metal geometry 610 is shown in FIGS. 6A and 6B.

In step 800 the underlying metal layer 610 is deposited.

In step 802 an optional interdiffusion barrier layer is deposited to prevent interdiffusion of the underlying metal layer 610 with the overlying metal layer 110 if it is needed. If it is not needed the embodiment ORBS layer 620 may be deposited directly on the underlying metal layer 610. If the underlying metal layer has been exposed to air, a degas step may be used. The degas step (for example a bake at 250 C to 400 C under reduced pressure) and/or a presputter clean step (for examples an argon presputter clean) or a reactive preclean (for example a high bias preclean with hydrogen plus argon or hydrogen plus helium) may be performed prior to the ORBS layer 620 deposition.

In step 804 the ORBS layer 620 is deposited on the underlying metal layer 610. The ORBS layer 620 may be a high nitrogen content TaN layer with a thickness between about 5 nm and 15 nm and a nitrogen content of about 20 atomic % to 35 atomic %. One tool that the ORBS film may be deposited in is an EnCoRel chamber on the Applied Endura platform. In this tool The ORBS layer may be deposited at room temperature with a pressure between about 2.5 to 5 torr, a power in the range of 15 to 30 KW, a bias in the range of 250 W to 500 W and a flow rate of nitrogen in the range of about 115 to 125 sccm. The deposition time may vary depending upon the deposition conditions. A time sufficient to deposit a TaN film with a thickness in the range of 5 nm to 15 nm is used.

Other deposition tools with different deposition conditions may be utilized by those skilled in the art to produce an equivalent ORBS TaN film with a thickness in the range of 5 nm to 15 nm and a nitrogen content in the range of 20 atomic % to 35 atomic %.

In step 806 the underlying metal is patterned and etched to form the underlying interconnect geometry 610. The ORBS layer 620 is etched first. The optional interdiffusion barrier layer is etched next if it is present. The underlying metal 610 is then etched.

In step 808 a dielectric layer 104 such as silicon dioxide or polyimide is deposited over the underlying dielectric 100 and metal layer 610.

In step 810 a pattern is formed on the dielectric layer 104 with openings over the underlying metal geometry 610. The dielectric material is etched out of the openings stopping on the ORBS layer 620. The ORBS layer 620 enables the IC wafers to be exposed to air for an extended period of time (24 hours) with little (less than 2×) increase in resistance. In addition the ORBS layer 620 provides for a tight distribution of contact resistance across the IC chip and across the IC wafer.

In step 812 an upper metal used for either interconnect or bondpad formation is deposited on the dielectric layer 104 and on the oxidation resistant (ORBS) barrier layer in the bottom of the contact openings.

In step 814 the upper metal used for either interconnect or bondpad formation is patterned and etched to form the upper interconnect metal geometries 110.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit, comprising the steps:
    forming an underlying metal geometry on a first dielectric;
    depositing a second dielectric layer over the underlying metal geometry and over the first dielectric;
    forming a contact photo resist pattern on the second dielectric layer with a contact opening over the underlying metal geometry;
    etching a contact opening through the second dielectric layer and stopping on the underlying metal geometry;
    depositing an overlying metal layer in the contact opening in the second dielectric layer;
    forming an oxidation resistant barrier layer between the underlying metal geometry and the overlying metal layer wherein the oxidation resistant barrier layer is tantalum nitride (TaN) or titanium nitride (TiN) with a nitrogen content of at least 20 atomic percent and a thickness of at least 5 nm;
    forming a photo resist pattern on the overlying metal layer with a geometry covering the contact opening; and
    etching the overlying metal layer with the photo resist pattern to form an overlying metal geometry.

2. The process of claim 1, wherein forming the oxidation resistant barrier layer comprises depositing an oxidation resistant barrier layer on the second dielectric layer and on the sides and bottom of the contact opening.

3. The process of claim 2, wherein the oxidation resistant barrier layer is deposited on the underlying metal geometry prior to depositing the second dielectric layer.

4. The process of claim 1 further comprising the step of exposing the oxidation resistant barrier layer to air for a period of time up to 24 hours prior to the step of depositing the overlying metal layer.

5. The process of claim 1 further comprising the step of depositing an interdiffusion barrier layer prior to the step of depositing the oxidation resistant barrier layer.

6. The process of claim 5, wherein the interdiffusion barrier layer is a TaN or TiN layer with a thickness between 60 nm and 90 nm and a nitrogen content in the range of 0 to 12 atomic percent.

7. The process of claim 1, wherein the oxidation resistance barrier layer is a TaN layer with a thickness in the range of 5 nm to 15 nm and a nitrogen content in the range of 20 to 35 atomic percent.

8. The process of claim 1, wherein the oxidation resistant barrier layer is TaN with a thickness in the range of 5 nm to 15 nm deposited at room temperature with a pressure between about 2.5 to 5 torr, a power in the range of 15 to 30 KW, a bias in the range of 250 W to 500 W, and a flow rate of nitrogen in the range of about 115 to 125 sccm.

9. A process of forming an integrated circuit, comprising the steps:
    depositing an underlying metal layer on a first dielectric layer;
    depositing an oxidation resistant barrier layer on the underlying metal layer wherein the oxidation resistant barrier layer is TaN or TiN with a nitrogen content of at least 20 atomic percent and a thickness of at least 5 nm;
    forming a photo resist pattern on the oxidation resistant barrier layer;
    etching the oxidation resistant barrier layer and etching the underlying metal layer to form an underlying metal geometry;
    depositing a second dielectric layer over the underlying metal geometry and over the first dielectric layer;
    forming a contact photo resist pattern on the second dielectric layer with a contact opening over the underlying metal geometry;
    etching a contact opening through the second dielectric layer and stopping on the oxidation resistant barrier layer on the underlying metal geometry;
    depositing an overlying metal layer wherein the overlying metal layer fills the contact opening in the second dielectric layer;
    forming a photo resist pattern on the overlying metal layer; and
    etching the overlying metal layer to form an overlying metal geometry which covers the contact opening in the second dielectric layer.

10. The process of claim 9, wherein the oxidation resistant barrier layer is TaN with a thickness in the range of 5 nm to 15 nm deposited at room temperature with a pressure between about 2.5 to 5 torr, a power in the range of 15 to 30 KW, a bias in the range of 250 W to 500 W, and a flow rate of nitrogen in the range of about 115 to 125 sccm.

11. The process of claim 9, further comprising the step of depositing an interdiffusion barrier layer prior to the step of depositing the oxidation resistant barrier layer.

12. The process of claim 11, wherein the interdiffusion barrier layer is a TaN or TiN layer with a thickness between 60 nm and 90 nm and a nitrogen content in the range of 0 to 12 atomic percent.

13. The process of claim 9, wherein the oxidation resistance barrier layer is a TaN layer with a thickness in the range of 5 nm to 15 nm and a nitrogen content in the range of 20 to 35 atomic percent.

14. A process of forming an integrated circuit, comprising the steps:
    forming an underlying metal geometry over a first dielectric;
    depositing a second dielectric layer over the first dielectric;
    etching a contact opening through the second dielectric layer;
    depositing an overlying metal layer in the contact opening;
    forming an oxidation resistant barrier layer between the underlying metal geometry and the overlying metal layer wherein the oxidation resistant barrier layer is TaN or TiN with a nitrogen content of at least 20 atomic percent and a thickness of at least 5 nm; and etching the overlying metal layer to form an overlying metal geometry.

15. The process of claim 14, wherein forming the oxidation resistant barrier layer comprises depositing an oxidation resistant barrier layer on the second dielectric layer and on the sides and bottom of the contact opening.

16. The process of claim 14, wherein the oxidation resistant barrier layer is deposited on the underlying metal geometry prior to depositing the second dielectric layer.

17. The process of claim 14, further comprising the step of exposing the oxidation resistant barrier layer to air for a period of time up to 24 hours prior to the step of depositing the overlying metal layer.

18. The process of claim 14, further comprising the step of depositing an interdiffusion barrier layer prior to the step of depositing the oxidation resistant barrier layer.

19. The process of claim 18, wherein the interdiffusion barrier layer is a TaN or TiN layer with a thickness between 60 nm and 90 nm and a nitrogen content in the range of 0 to 12 atomic percent.

20. The process of claim 14, wherein the oxidation resistant barrier layer is a TaN layer with a thickness in the range of 5 nm to 15 nm and a nitrogen content in the range of 20 to 35 atomic percent.

\* \* \* \* \*